US008531235B1

(12) United States Patent
Zonte

(10) Patent No.: US 8,531,235 B1
(45) Date of Patent: Sep. 10, 2013

(54) CIRCUIT FOR A CURRENT HAVING A PROGRAMMABLE TEMPERATURE SLOPE

(75) Inventor: Cristinel Zonte, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 66 days.

(21) Appl. No.: 13/326,773

(22) Filed: Dec. 15, 2011

Related U.S. Application Data

(60) Provisional application No. 61/566,383, filed on Dec. 2, 2011.

(51) Int. Cl.
*H01L 35/00* (2006.01)

(52) U.S. Cl.
USPC .......... 327/512; 327/539

(58) Field of Classification Search
USPC .......... 327/512, 513, 537, 539
See application file for complete search history.

(56) References Cited

U.S. PATENT DOCUMENTS

| | | | | |
|---|---|---|---|---|
| 7,446,598 | B2 * | 11/2008 | Pertijs et al. | 327/539 |
| 8,102,201 | B2 * | 1/2012 | Marinca | 327/539 |
| 8,262,286 | B2 * | 9/2012 | Peterson et al. | 374/170 |
| 8,390,363 | B2 * | 3/2013 | Engl | 327/512 |

* cited by examiner

*Primary Examiner* — Jeffrey Zweizig

(57) ABSTRACT

A current reference circuit configured to generate a reference current with a programmable temperature slope is disclosed. The current reference circuit includes a resistor. The current reference circuit includes a bandgap voltage circuit configured to generate a bandgap voltage and coupled to the resistor. The current reference circuit includes a bias voltage circuit configured to generate a variable-polarity bias voltage and coupled to the bandgap voltage circuit. The bandgap voltage circuit is configured to add the variable-polarity bias voltage to the bandgap voltage to generate the reference current through the resistor.

21 Claims, 10 Drawing Sheets

CIRCUIT FOR A CURRENT HAVING A PROGRAMMABLE TEMPERATURE SLOPE

RELATED APPLICATIONS

This application claims the benefit of and priority to the U.S. Provisional Application No. 61/566,383 filed Dec. 2, 2011.

TECHNICAL FIELD

The present invention relates generally to analog circuits, and more particularly, analog current reference circuits with known temperature coefficients.

BACKGROUND

Many applications of analog circuits require stable, predictable current references. These applications may include, but are not limited to, sensing and amplification circuits, signal converters, signal conditioning circuits, programmable reference signals, signal comparators, temperature controlled clock generators, temperature controlled delay circuits, function generators, noise generators, measurement systems, power optimization and protection circuits. In some applications, predictability translates to a circuit which produces a constant voltage or current over time, temperature, process variations, etc.

Not all applications require stringent immunity to environmental and process parameters, but may require only a predictable variation with a given parameter. For example, an application may require currents that vary over temperature in a predictable way, such as a current reference with a positive, linear slope versus increasing temperature. The related art includes devices that employ independent circuits for producing proportional to absolute temperature current references, constant (i.e., zero temperature coefficient) current references, and complementary (i.e., negative slope) to absolute temperature current references, respectively. Still other related art current references may be based on multiple resistors having different temperature coefficients.

Unfortunately, related art current references generally do not provide for temperature slope control or may suffer from large size and power inefficiencies due to their complexity or suffer from high sensitivity to process variations.

BRIEF DESCRIPTION OF THE DRAWINGS

Embodiments of the present invention will be more readily understood from the detailed description of exemplary embodiments presented below considered in conjunction with the attached drawings in which like reference numerals refer to similar elements and in which.

DETAILED DESCRIPTION

Figure 1:
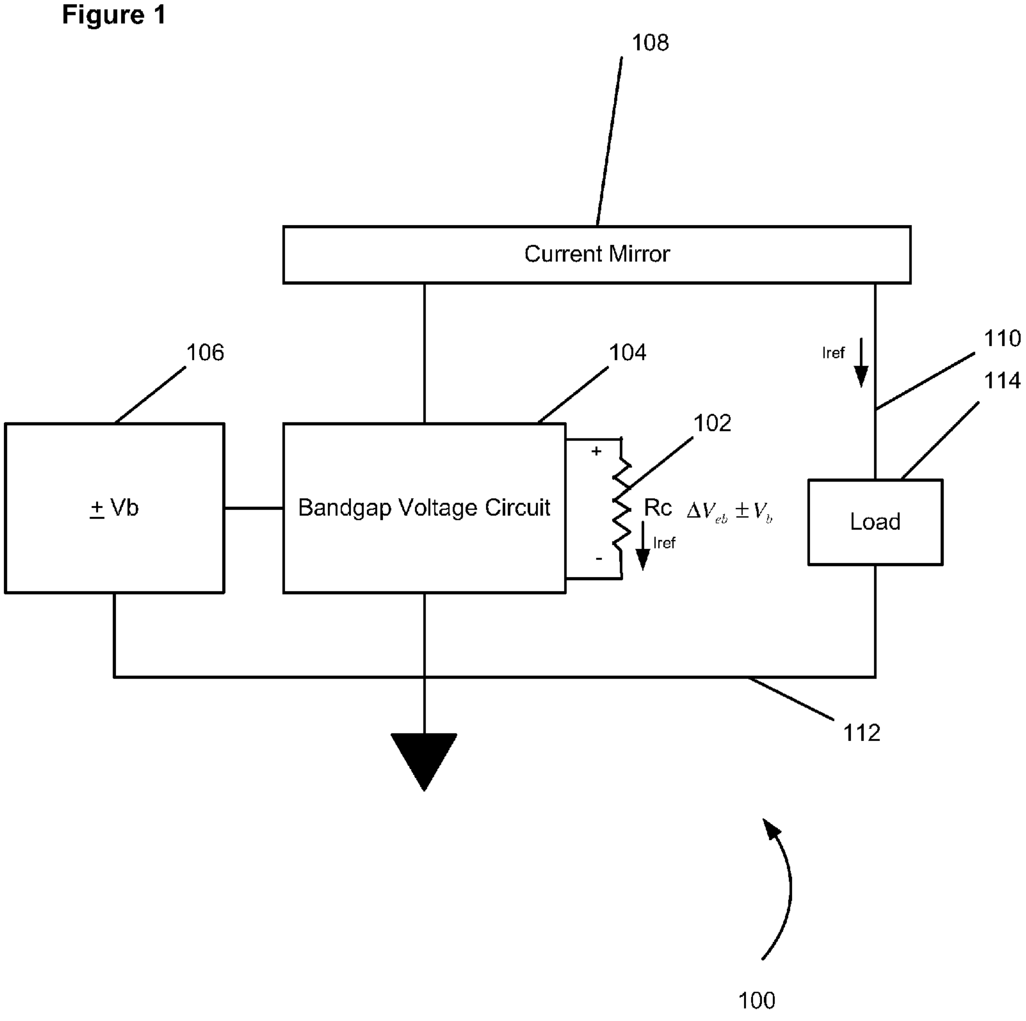
FIG. 1 depicts an electrical block diagram of one embodiment of a current reference circuit configured to generate a current having a programmable temperature slope.

A current reference circuit configured to generate a current with a programmable temperature slope is disclosed. In an embodiment, the current reference circuit includes a resistor. The current reference circuit includes a bandgap voltage circuit configured to generate a bandgap voltage and coupled to the resistor. The current reference circuit includes a bias voltage circuit configured to generate a variable-polarity bias voltage and coupled to the bandgap voltage circuit. The bandgap voltage circuit is configured to add the variable-polarity bias voltage to the bandgap voltage to generate the reference current through the resistor.

In another embodiment, the current reference circuit includes a resistor. A bandgap voltage circuit is coupled to the resistor. The current reference circuit includes a bandgap voltage circuit configured to generate a bandgap voltage and coupled to the resistor. The current reference circuit includes a bias voltage circuit configured to generate a bias voltage and coupled to the bandgap voltage circuit. The current reference circuit includes at least one switch coupled between the bias voltage circuit and the bandgap voltage circuit and configured to change a polarity of the bias voltage applied to a bias terminal of the bandgap voltage circuit, The bandgap voltage circuit is configured to add the bias voltage to the bandgap voltage to generate the reference current through the resistor.

For both embodiments, the current reference circuit is configured to have a temperature slope that is programmable to be positive, zero, or negative. In an embodiment, the bandgap voltage circuit includes a first bipolar transistor having the normalized area of 1 (1 is used here as a reference for area ratio) coupled to a second bipolar transistor having the area of M (the area of the second bipolar transistor is M times the area of first bipolar transistor). The bandgap voltage of the bandgap voltage circuit is determined by a difference between emitter-base voltages of the first bipolar transistor and the second bipolar transistor. A first switch may be coupled to the base of the first bipolar transistor and a second switch may be coupled to the base of the second transistor. The first switch and the second switch may be configured to apply a bias voltage to either the base of the first bipolar transistor or the base of the second bipolar transistor. The first switch and the second switch may also be configured to apply ground potential to the other of the base of the first bipolar transistor or the base of the second bipolar transistor.

In an embodiment, the bandgap voltage circuit may also include a current minor coupled to the two bipolar transistors emitters as well as to the output load. The current mirror is driven by the output of an operational amplifier having the inputs connected such that the bandgap voltage is applied to the resistor in order to generate a current having a programmable temperature slope which is applied (mirrored) to a load. The operational amplifier is coupled between the first branch and the second branch of the current mirror to force the first branch and the second branch of the current mirror to a common potential, permitting the bandgap voltage to be applied to the resistor.

In an embodiment, one application of the current reference circuit is in a current-controlled sensing circuit for reading the data stored in a non-volatile memory cell. The generated current having the programmable temperature slope is a current reference of a sensing circuit (usually known as a sense amplifier) employed to read data from a non-volatile memory cell where a comparison is performed between memory cell current with the reference current. In order to perform an accurate reading operation for various operation conditions, this reference current can be programmed so that it has an optimum value and variation (slope) with respect to the current through the non-volatile memory cell corresponding to the two possible logic states stored (sensing window optimization). Alternatively, the current reference circuit may be used in other circuits, such as other sensing and amplification circuits, signal converters, signal conditioning circuits, programmable reference signals, signal comparators, temperature controlled clock generators, temperature controlled delay circuits, function generators, noise generators, measurement systems, power optimization and protection circuits, or the like, as would be appreciated by one of ordinary skill in the art having the benefit of this disclosure.

Possible advantages of employing the above current reference circuit may include providing an accurate and versatile current reference for applications requiring a programmable temperature slope. Embodiments of the current reference circuit are implemented as low area, low complexity circuits that are able to generate currents having programmable positive, zero or negative temperature slopes. Embodiments of the current reference circuit are applicable to a broad area of applications for analog or digital systems that can be manufactured at low cost and can be operated with low power consumption.

FIG. 1 depicts an electrical block diagram of one embodiment of a current reference circuit 100 configured to generate a reference current $I_{REF}$ having a programmable temperature slope. The current reference circuit 100 includes a resistor 102 ($R_C$) with a known temperature coefficient $\alpha$. In one embodiment, the resistor 102 may be, for example, a diffusion resistor. In another embodiment, the resistor 102 may digitally programmable.

The current reference circuit 100 includes a bandgap voltage circuit 104 configured to generate a bandgap voltage $\Delta V_{eb}$ and coupled to the resistor 102 to apply the bandgap voltage $\Delta V_{eb}$ combined (+/−) with a voltage Vb to the resistor 102. This generates a current $I_{REF}$ through the resistor 102 having the programmable temperature slope. In an embodiment, a bias voltage circuit 106 is configured to apply the variable-polarity bias voltage $\pm V_b$ to the bandgap voltage circuit 104. In an embodiment, a magnitude of the bias voltage $\pm V_b$ of the bias voltage circuit 106 may be programmable.

In the depicted embodiment, the bandgap voltage circuit 104 combines the bandgap voltage $\Delta V_{eb}$ with variable-polarity bias voltage $\pm V_b$ and applies this combined voltage across the resistor 102 to generate the current $I_{REF}$. The reference current $I_{REF}$ is transmitted to a current mirror 108. The current minor 108 is configured to provide $I_{REF}$ between an external terminal 110 and ground potential 112, to which a load 114 is inserted. Since the circuit 106 and the resistor 102 are programmable, the reference current $I_{REF}$ is itself programmable. In an embodiment, the programmable reference current $I_{REF}$ may have either positive, zero, or a negative temperature slope.

Figure 2:
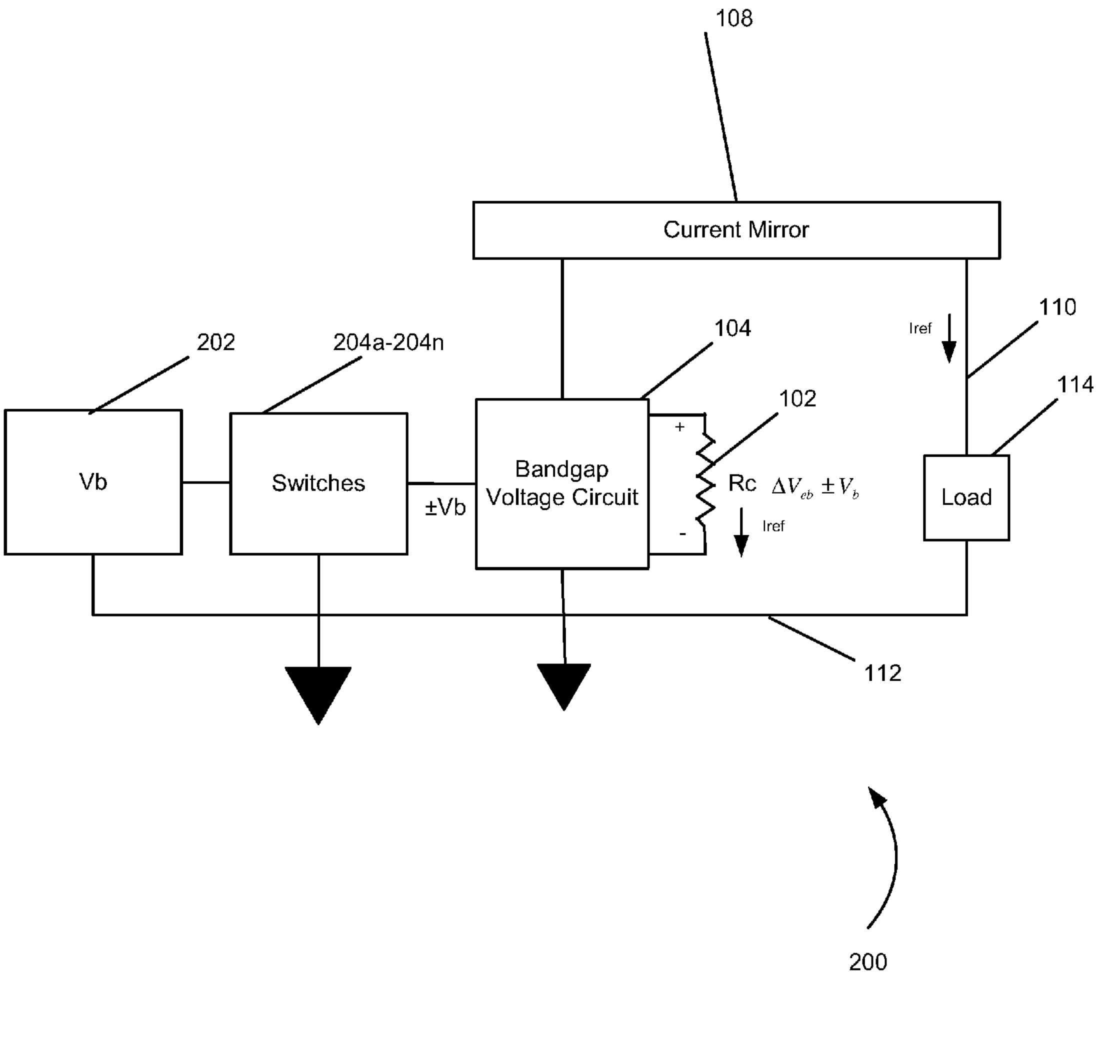
FIG. 2 depicts an electrical block diagram of another embodiment of current reference circuit configured to generate a current having a programmable temperature slope.

FIG. 2 depicts an electrical block diagram of a second embodiment of a current reference circuit 200 configured to generate a reference current $I_{REF}$ having a programmable temperature slope. Like reference numbers refer to similar elements. The current reference circuit 200 includes a resistor 102 ($R_C$) with a known temperature coefficient $\alpha$. In one embodiment, the resistor 102 may be, for example, a diffusion resistor. In another embodiment, the resistor 102 may digitally programmable.

The current reference circuit 200 includes a bandgap voltage circuit 104 configured to generate a bandgap voltage $\Delta V_{eb}$ and coupled to the resistor 102 to apply the bandgap voltage $\Delta V_{eb}$ combined (+/−) with a voltage Vb to the resistor 102. This generates the current $I_{REF}$ having the programmable temperature slope through the resistor 102. In an embodiment, a bias voltage circuit 202 is configured to generate a bias voltage $V_b$ coupled to the bandgap voltage circuit 104 through switches 204*a*-204*n* configured to change a polarity of the bias voltage $V_b$ of the bias voltage circuit 202 applied to a bias terminal of the bandgap voltage circuit 104. The operation of the switches 204*a*-204*n* is described in more detail with respect to FIG. 4. In an embodiment, a magnitude of the bias voltage $V_b$ of the bias voltage circuit 202 may be programmable. The main difference between the embodiments depicted in FIGS. 1 and 2 is that in FIG. 1, the bias voltage circuit 106 generates a variable-polarity bias voltage $\pm V_b$, while in FIG. 2, the bias voltage circuit 202 generates a bias voltage $V_b$ with a polarity that is rendered switchable by the switches 204*a*-204*n*. The components 104-118 are otherwise identical in type and function to those of FIG. 1.

In the depicted embodiment, the bandgap voltage circuit 104 combines the bandgap voltage $\Delta V_{eb}$ with variable-polarity bias voltage $\pm V_b$ and applies this combined voltage across the resistor 102 to generate the current $I_{REF}$. The reference current $I_{REF}$ is transmitted to a current mirror 108. The current minor 108 is configured to provide $I_{REF}$ between an external terminal 110 and ground potential 112, to which a load 114 is inserted. Since the circuit 202 and the resistor 102 are programmable, the reference current $I_{REF}$ is itself programmable. In an embodiment, the programmable reference current $I_{REF}$ may have either positive, zero, or a negative temperature slope.

Figure 3:
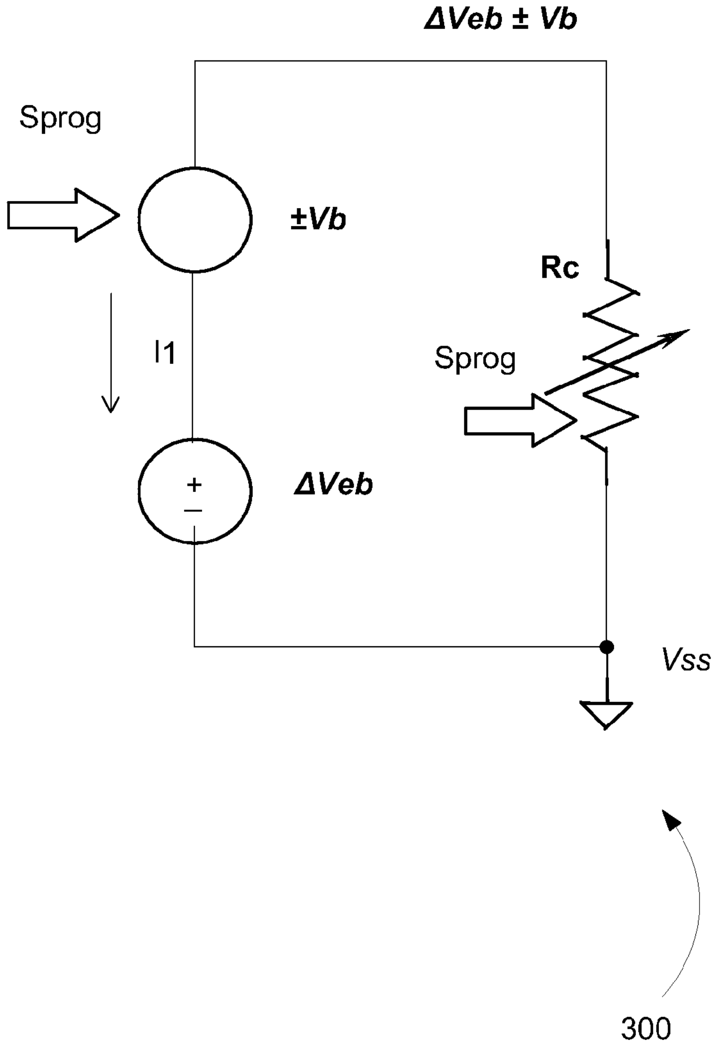
FIG. 3 depicts an electrical schematic diagram of a simplified equivalent circuit of the circuits of FIGS. 1 and 2, respectively.

FIG. 3 depicts an electrical schematic diagram 300 of a simplified equivalent circuit of the circuits 100, 200 of FIGS. 1 and 2, respectively. The current reference circuit 100, 200 is configured to sum the programmable, variable-polarity bias voltage $\pm V_b$ with the bandgap voltage $\Delta V_{eb}$ and apply the total voltage $\Delta V_{eb} \pm V_b$ to the resistor 102 ($R_C$). In an embodiment, the bandgap voltage $\Delta V_{eb}$ is generated in a bandgap voltage circuit 104 as the difference between the emitter-base voltages of two bipolar transistors having different current densities (due to different area). $\Delta V_{eb}$ and +Vb or −Vb are summed depending on which bipolar transistor's base Vb is applied while the voltage applied to the other transistor's base is ground potential.

Figure 4:
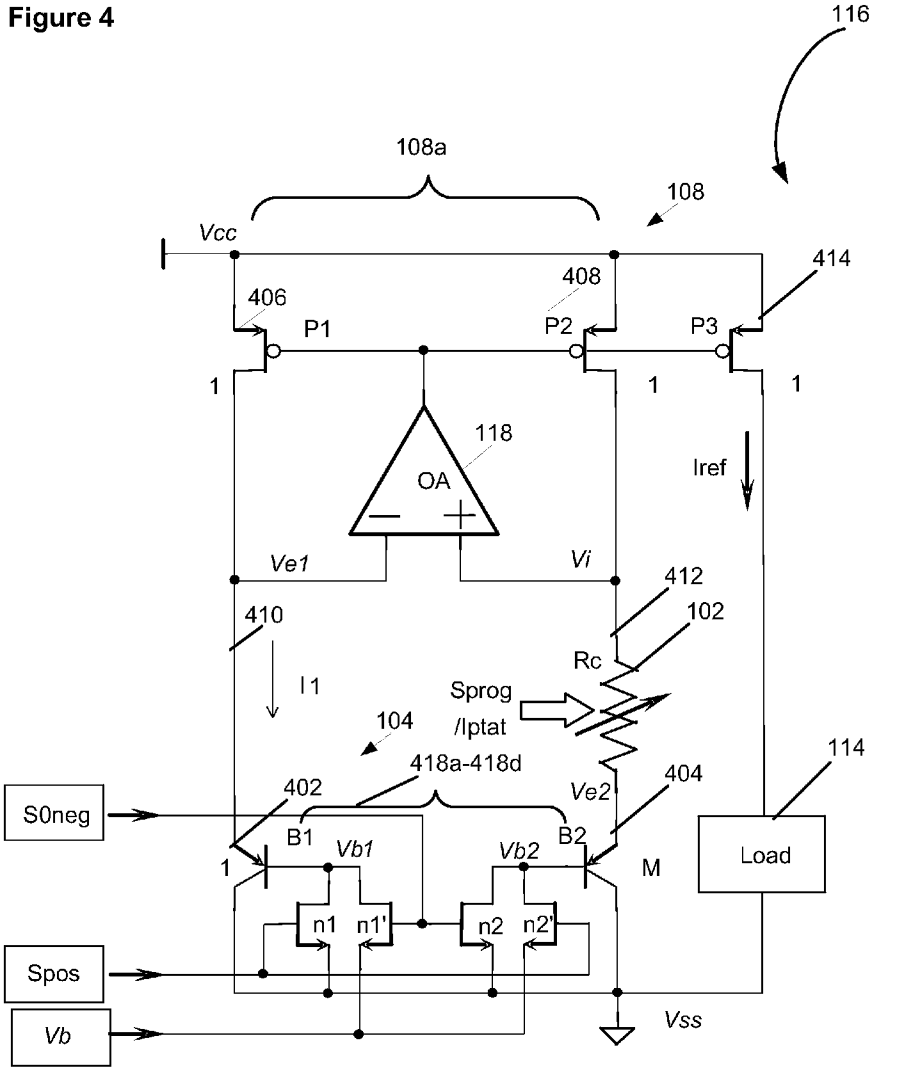
FIG. 4 depicts a detailed electrical schematic diagram of one embodiment of the current reference circuit of FIG. 2 with the bias voltage circuit not included and only a bias voltage Vb applied.
Figure 5:
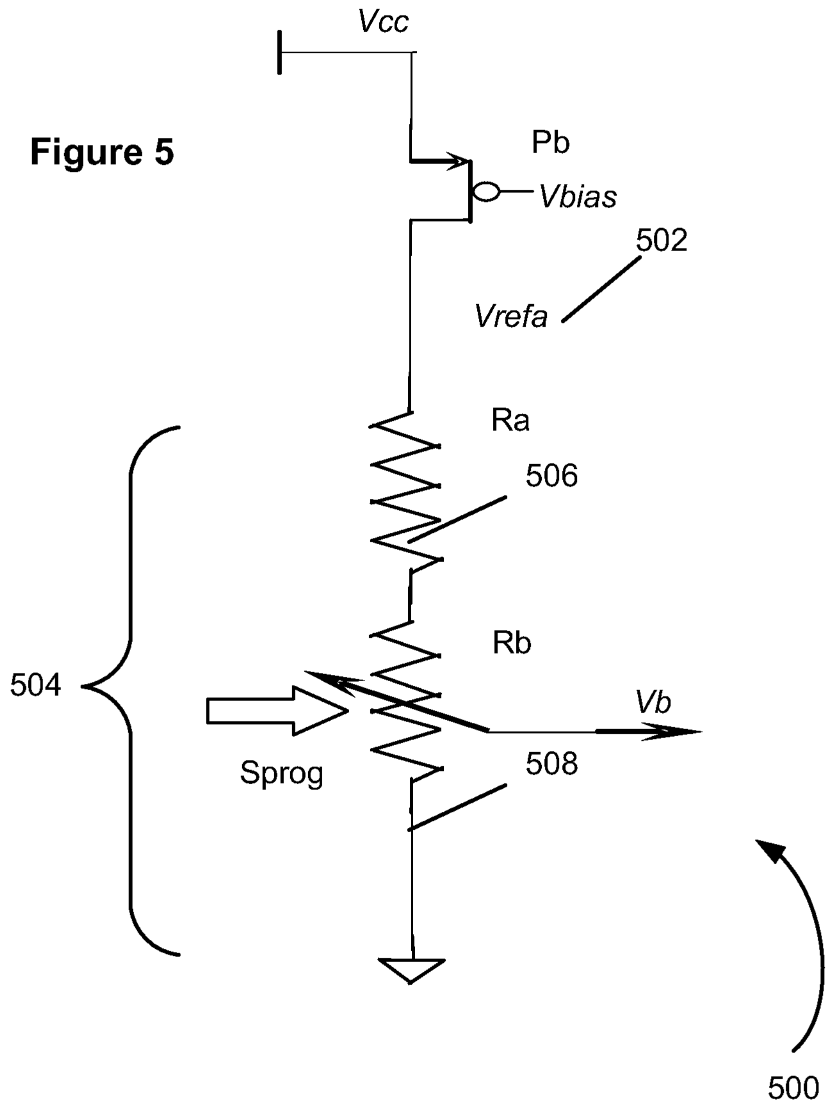
FIG. 5 is an electrical schematic block diagram of one embodiment of the bias voltage circuit for generating a bias voltage Vb.
Figure 6:
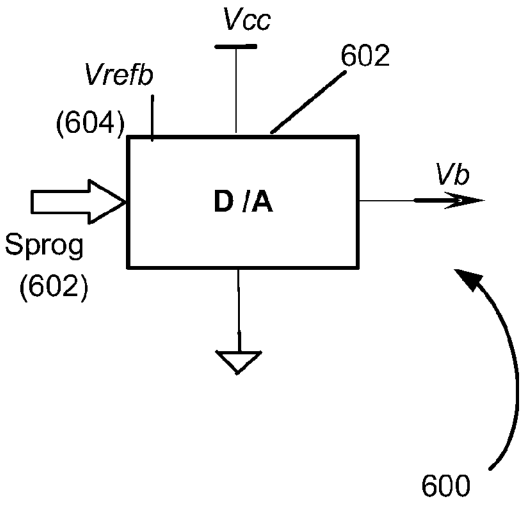
FIG. 6 is an electrical schematic block diagram of another embodiment of the bias voltage circuit of FIG. 2 for generating the bias voltage Vb.

FIG. 4 depicts a detailed electrical schematic diagram of one embodiment of a current reference circuit 400. Two embodiments of implementations of the bias voltage circuit 202 are depicted in FIGS. 5 and 6 to be described below. The current reference circuit 400 may include bandgap voltage circuit 104 employing two bipolar p-n-p transistors 402, 404 (also labeled B1 and B2, respectively) with an area ratio of $Area_{B2}/Area_{B1}=M$, M>1. The bandgap voltage circuit 104 may be coupled to a current minor 108 which may be implemented on one side 108*a* with a pair of p-type metal-oxide semiconductor (PMOS) field-effect transistor (FETs) 406, 408 (also labeled P1 and P2, respectively) connected two corresponding branches 410, 412 of the bandgap voltage circuit 104. Output current may be provided by a third PMOS transistor 414 (also labeled P3) configured to provide the current of the current minor 108 to a load 114. The right side branch 412 of the bandgap voltage circuit 104 includes the larger bipolar device of area M and includes the resistor 102 (also labeled Rc) having a known temperature coefficient α. The current reference circuit 400 also includes an operational amplifier 118 configured to set the first branch 410 and the second branch 412 of the one side 108*a* of the current minor 108 to a common potential on the nodes Ve1 and Vi.

The bases of the bipolar transistors B1 and B2, instead of being connected to Vss (vgnd) as is known bandgap circuit configurations, are connected through the n-type metal oxide semiconductor (NMOS) FETs transistor 418*a*-418*d* configured as switches n1, n1' and n2, n2' either to Vss (vgnd) or to the bias voltage Vb. The switches 418*a*-418*d* are controlled by the two logic signals Spos and S0*neg* which represent the selection signals for the slope polarity of the current generated as a function of the temperature.

The difference between the emitter-base voltages $\Delta V_{eb}$ of two bipolar p-n-p transistors 402, 404 may be generated by a difference in current densities flowing through the first bipolar transistor 402 and the second bipolar transistor 404 and is proportional to a difference in area through which current flows in the first bipolar transistor 402 and the second bipolar transistor 404 with a ration of M: 1. In another embodiment, the current reference circuit 400 may be implemented with opposite doping-type transistors substituted for the transistors 402, 404 (n-p-n), transistors 406, 408, 412 (NMOS), and transistors 418*a*-418*d* (PMOS) as would be appreciated by one of ordinary skill in the art having the benefit of this disclosure.

Figure 5A:
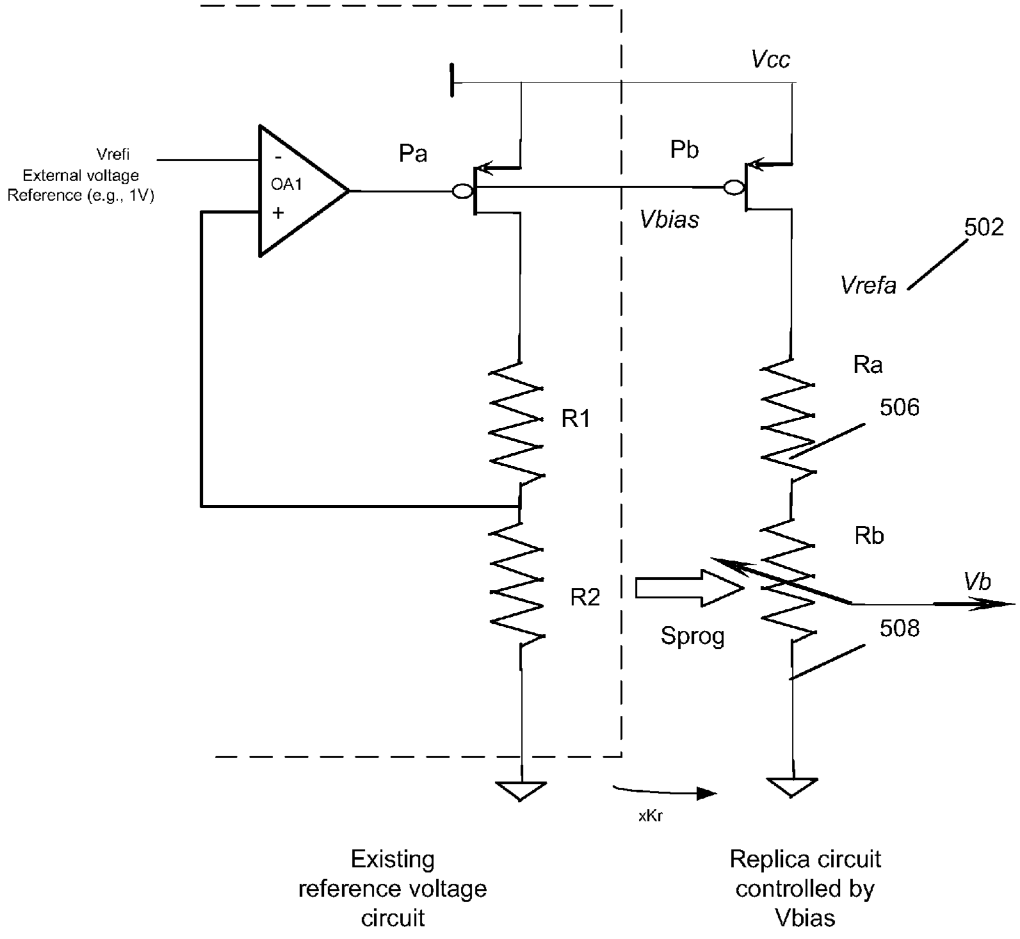
FIG. 5*a* is a detailed electrical schematic of one method for generating the bias voltage Vb of FIG. 5 from an existing bias voltage, Vbias (e.g. as a protection voltage for non-volatile memories) using a replica circuit with a multiplication factor of Kr.

FIG. 5 is an electrical schematic block diagram of one embodiment 500 of the bias voltage circuit 202 for generating the bias voltage Vb. In the embodiment shown, Vb may be generated from an external reference voltage Vrefa (502) in a closed loop circuit including a resistor divider 504 including resistors 506, 508 (also labeled Ra and Rb) and an operational amplifier (not shown). In another embodiment, Vb may be generated from an existing bias voltage Vbias (generated itself from a constant reference voltage), in which case the resistor divider 504 and a driving PMOS transistor Pb are replica components of a circuit which generates Vbias shown in FIG. 5*a*. In either of the implementations, the voltage applied to the resistor divider 504, (upper terminal of Ra), is a constant, accurate reference voltage Vrefa, which is divided by the second, programmable resistor Rb, at the value Vb. In an embodiment, the value Vb may be varied in the range of 0 mV to about 200 mV depending on the parameters of the current reference components as well as the programmed slope of the current-temperature characteristic.

The resistor divider 504 is programmed using a digital input, e.g., a binary input Sprog. In one embodiment, the number of the programming bits of the digital input Sprog depends on a user-selected resolution—typically 2 to 4 or more bits.

FIG. 6 is an electrical schematic block diagram of another embodiment 600 of the bias voltage circuit 202 for generating the bias voltage Vb. In the embodiment shown, Vb may be generated from a digital to analog converter (DAC) circuit 602 with as input a reference voltage Vrefb (604), and a digital input, e.g., a binary input Sprog (606).

Returning to FIG. 4, assuming that the difference between the potential of nodes Ve1 and Vi is negligible (zero) due to a high DC gain for the operational amplifier 118, and assuming that a second order temperature coefficient of the resistor Rc is negligible, the following equations may be employed to select the programmable reference current $I_{REF}$ to have either positive, zero, or a negative temperature slope, respectively: In one embodiment, for a positive polarity slope (current proportional to absolute temperature): Spos=Vcc, S0*neg*=0 resulting Vb1=0, Vb2=Vb with to n1 and n2' set to "on" and n1' and n2 set to "off". It should be note that the current $I_I$ in Equations 1-3 below is the same as the current on the right branch 412 of FIG. 4 (i.e., where Rc is located) as well as the same as $I_{ref}$ due to the current mirror 108 including FET devices (PMOS) having the same size (ratio is 1:1:1):

$$R_c = R_0[1+\alpha(T-T_0)]$$

$$V_{eb1} = I_1 * R_c + V_{eb2} + V_b$$

$$V_{eb1} - V_{eb2} = \left(\frac{KT}{q}\right)\ln M$$

$$I_1 = \frac{\left(\frac{KT}{q}\ln M\right) - V_b}{R_0[1+\alpha(T-T0)]} \rightarrow \text{Eqn. 1}$$

where $V_{eb1}$, $V_{eb2}$ the emitter-base voltage of the bipolar transistors B1, B2; K is Boltzmann's constant; T is absolute temperature in Kelvin; q is the elementary charge; Ro is the value of the resistor Rc at temperature $T_0$, and $T_0$ is a user-selected reference temperature.

Equation 1 shows that as Vb increases, the current variation with the temperature (temperature slope) increases. Rc is adjusted with Vb by the programming inputs Sprog in order to keep the same current value at temperature $T_0$. Alternatively, other equations may be used to programming the positive polarity slope as would be appreciated by one of ordinary skill in the art having the benefit of this disclosure.

In one embodiment, for a zero slope (constant current across the temperature): Spos=0, S0*neg*=Vcc resulting Vb1=Vb, Vb2=0 with n1' and n2 set to "on" and n1 and n2' set to "off" as follows:

$$I_1 = \frac{\left(\frac{KT}{q}\ln M\right) + V_b}{R_0[1+\alpha(T-T0)]}$$

$$Vb = \left(\frac{KT}{q}\ln M\right) * \frac{1-\alpha T_0}{\alpha} \rightarrow \text{Eqn. 2}$$

$$I_1 = \frac{\frac{K}{q}\ln M}{\alpha R_0} \rightarrow \text{Eqn. 3}$$

Equation 2 shows the value of the Vb voltage for which the current given by Equation 3 is constant (independent of temperature or the temperature slope is zero). Alternatively, other equations may be used to programming the zero slope as would be appreciated by one of ordinary skill in the art having the benefit of this disclosure.

In one embodiment, for a negative polarity slope (current complementary to absolute temperature): Spos=0, S0*neg*=Vcc resulting Vb1=Vb, Vb2=0 with n1' and n2 set to "on" and n1 and n2' set to "off", and when $$Vb > \left(\frac{KT}{q}\ln M\right) * \frac{1-\alpha T_0}{\alpha} \rightarrow \text{Eqn 4}$$

Equation 4 shows the minimum value of Vb for which current variation with temperature becomes negative. Rc is adjusted with Vb by the programming inputs Sprog in order to keep the same current value at temperature $T_0$. Alternatively, other equations may be used to programming the negative polarity slope as would be appreciated by one of ordinary skill in the art having the benefit of this disclosure.

Figure 7:
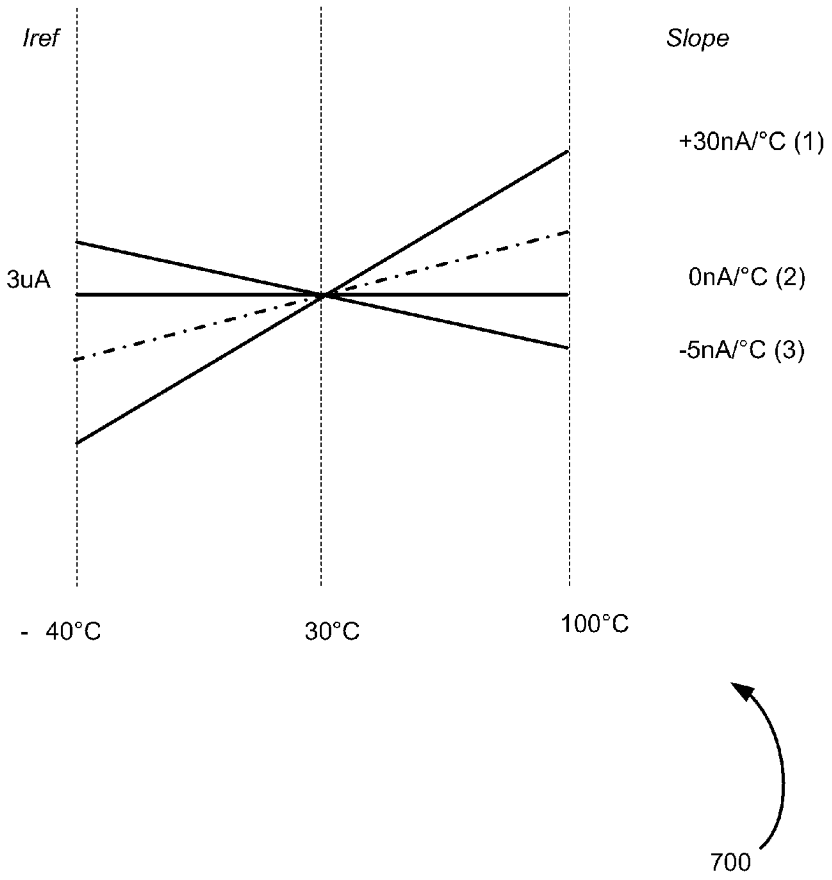
FIG. 7 is a plot of output current variation versus temperature for a practical circuit implemented according to the embodiment depicted in FIG. 4.

FIG. 7 is a plot 700 of output current variation versus temperature for a circuit implemented according to the embodiment depicted in FIG. 4. In the example shown in FIG. 7, the current value at the reference temperature $T_0$ is 3 uA. The maximum positive temperature slope implemented is 30 nA/° C. in steps of 5 nA/° C. and the minimum negative temperature slope is 5 nA/° C. The resistor in this implementation is a diffusion resistor with positive temperature coefficient. The bipolar transistors' bias voltage Vb is in the range of 10 mV to 120 mV. The global accuracy across the process variation for devices, power supply voltage, and temperature is less than 3%. This shows that, in addition to providing a variable temperature slope, the current reference circuit 400 of FIG. 4 may be employed in applications that require high accuracy. The currents and temperatures depicted in FIG. 7 are only examples. Other values may be used as would be appreciated by one of ordinary skill in the art having the benefit of this disclosure.

Figure 8:
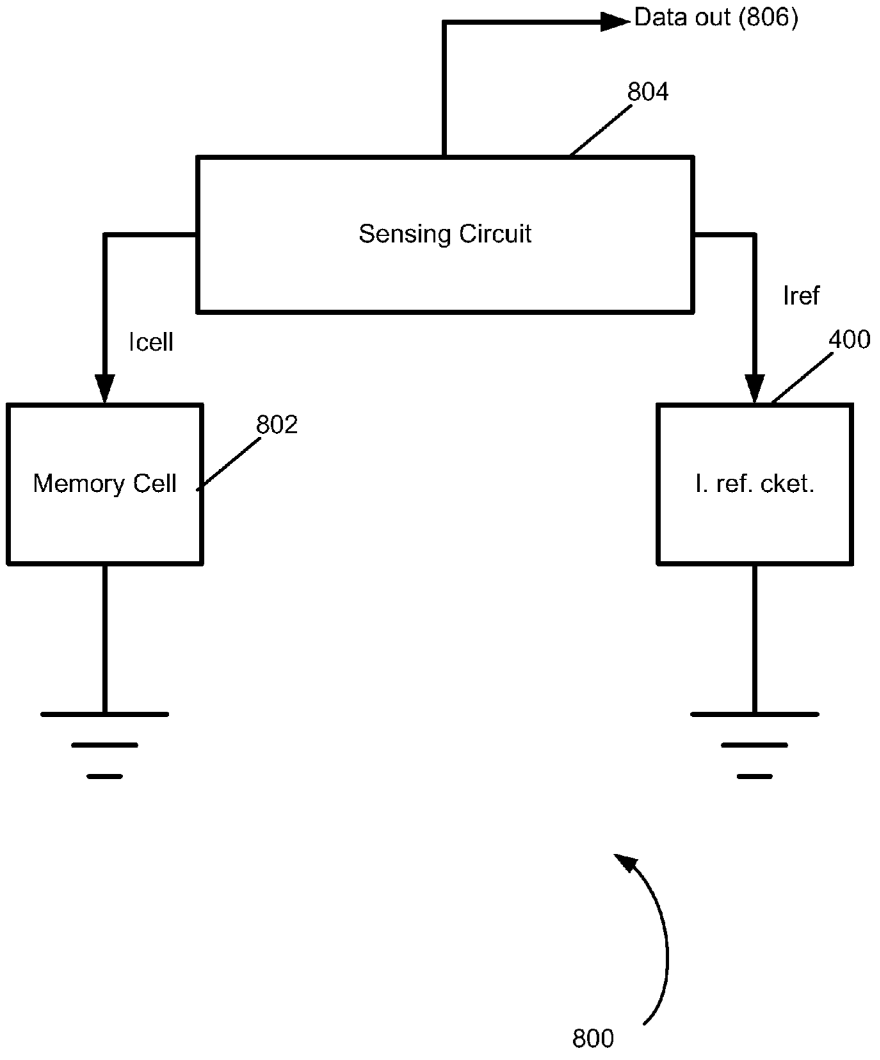
FIG. 8 is a block diagram of a sensing circuit for a single non-volatile memory cell employing the current reference circuit of FIG. 4 for optimizing a sensing window.

One application for the current reference circuit 400 of FIG. 4 that may be programmed to have a positive, zero, or negative temperature slope is in the implementation of sensing circuits for non-volatile memory cells. The current reference circuit 400 may be programmed to optimize a sensing window across a large range of temperatures. FIG. 8 is a block diagram 800 of a single non-volatile memory cell 802 employing the current reference circuit 400 of FIG. 4 for optimizing a sensing window. A current sensing circuit 804 is employed to compare the current throughout the non-volatile memory cell 802 and the current reference circuit 400. The sensing circuit 804 is a current sensing amplifier which behaves similar to a current comparator. The purpose of the sensing circuit 804 is to make a decision about the logic state of the non-volatile memory cell 802 relative to the current produced by the current reference circuit 400. The sensing circuit 804 includes a data output line 806 which outputs a logical 0 if the current output by the non-volatile memory cell 802, $I_{cell}$ is greater than the current output by the current reference circuit 200, $I_{ref}$, and outputs a logical 1 otherwise. Employing the current reference circuit 400 insures that $I_{ref}$ is a reference point that permits proper sensing over a desired temperature range. For example, $I_{ref}$ may be set to be about half way between $I_{cell}$ over a desired temperature range of operation of the non-volatile memory cell 802.

Figure 9:
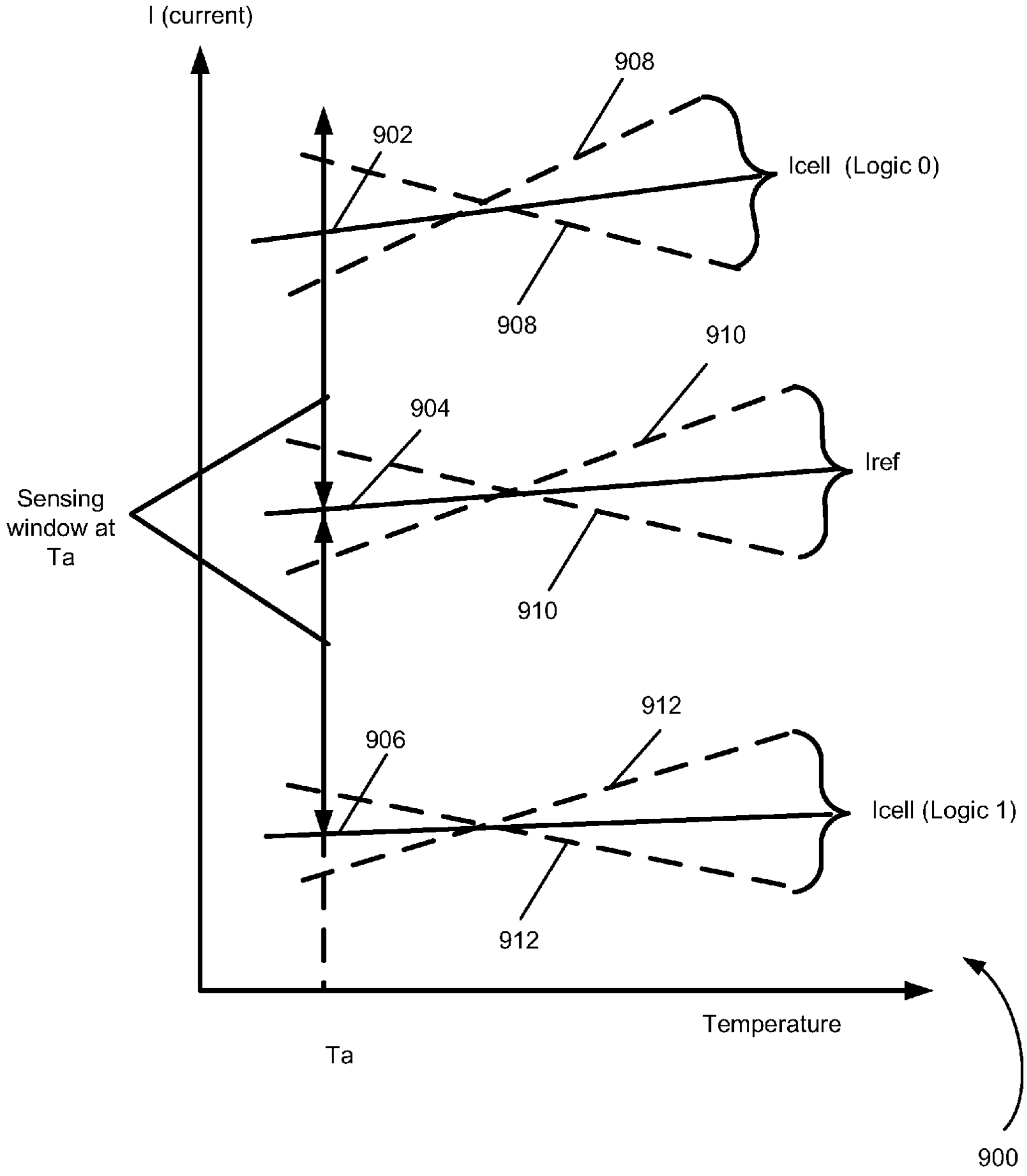
FIG. 9 is a plot of current variation versus temperature for a reference current generated by the current reference circuit of FIG. 4 and an output current of a single non-volatile memory cell in both a logical 0 and logical 1 state versus temperature.

FIG. 9 is a plot of current variation versus temperature 900 for $I_{ref}$ and $I_{cell}$ in both a logical 0 and logical 1 state versus temperature which demonstrates how the current reference circuit 400 of FIG. 4 may be programmed to optimize a sensing window. The solid lines 902, 904, 906 show current variation over temperature for $I_{ref}$ and $I_{cell}$ in both a logical 0 and logical 1 states, respectively, while the dashed lines 908, 910, 912 show the variations in same due to process variations and therefore the need to vary $I_{ref}$ over temperature with a precisely controlled slope so as to clearly distinguish between a logical 0 and logical 1 of the memory cell 802.

In addition to optimizing a sensing window of a current sensing circuit for non-volatile memory cells and the other applications mentioned above, embodiments of the present invention may be employed to generate a voltage from a programmable reference current, to generate a digital clock with its frequency controlled by the programmable reference current, etc. Alternatively, the current reference circuit may be used as a current reference for circuits, such as sensing and amplification circuits, signal converters, signal conditioning circuits, programmable reference signals, signal comparators, temperature controlled clock generators, temperature controlled delay circuits, function generators, noise generators, measurement systems, power optimization and protection circuits, or the like, as would be appreciated by one of ordinary skill in the art having the benefit of this disclosure.

In an embodiment, the current reference circuit 400 of FIG. 4 may be implemented with opposite polarity transistors. In addition, alternative implementations may include, for example, employing a cascoded current minor for increased accuracy as well as the use of a digitally controlled current minor at the output for additional programmability of the reference current as would be appreciated by one of ordinary skill in the art having the benefit of this disclosure.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit, comprising a current reference circuit configured to generate a reference current having a programmable temperature slope, wherein the current reference circuit comprises:

a resistor;

a bandgap voltage circuit configured to generate a bandgap voltage and coupled to the resistor; and a bias voltage circuit configured to generate a variable-polarity bias voltage and coupled to the bandgap voltage circuit, wherein the bandgap voltage circuit is configured to add the variable-polarity bias voltage to the bandgap voltage to generate the reference current through the resistor.

2. The circuit of claim 1, wherein the current reference circuit further comprises a current mirror coupled to the bandgap voltage circuit and configured to apply the reference current having the programmable temperature slope to a load.

3. The circuit of claim 2, wherein the load is part of a current sensing circuit for a non-volatile memory cell and the reference current having the programmable temperature slope is a current reference of the current sensing circuit for which the sensing window is set for optimal sensing of the current throughout a non-volatile memory cell.

4. The circuit of claim 2, wherein the current minor comprises a first field-effect transistor (FET) coupled to one terminal of the bandgap voltage circuit to form a first branch;

a second FET coupled to a first terminal of the resistor, wherein the second terminal of the resistor is coupled to a second terminal of the bandgap voltage circuit to form a second branch; and a third FET coupled to the first FET and the second FET and configured to apply the reference current having the programmable temperature slope to the load.

5. The circuit of claim 2, wherein the current reference circuit further comprises an operational amplifier for setting a first branch and a second branch of the current mirror to a common potential.

6. The circuit of claim 1, wherein the bias voltage circuit comprises a digital-to-analog converter coupled to the bandgap voltage circuit.

7. The circuit of claim 1, wherein the bias voltage circuit comprises a programmable voltage divider coupled to the bandgap voltage circuit.

8. A circuit, comprising:

a current reference circuit configured to generate a reference current having a programmable temperature slope, wherein the current reference circuit comprises:

a resistor;

a bandgap voltage circuit configured to generate a bandgap voltage and coupled to the resistor;

a bias voltage circuit configured to generate a bias voltage and coupled to the bandgap voltage circuit; and at least one switch coupled between the bias voltage circuit and the bandgap voltage circuit and configured to change a polarity of the bias voltage applied to a bias terminal of the bandgap voltage circuit, wherein the bandgap voltage circuit is configured to add the bias voltage to the bandgap voltage to generate the reference current through the resistor.

9. The circuit of claim 8, wherein the current reference circuit further comprises a current mirror coupled to the bandgap voltage circuit and configured to apply the reference current having the programmable temperature slope to a load.

10. The circuit of claim 9, wherein the load is part of a current sensing circuit for a non-volatile memory cell and the reference current having the programmable temperature slope is a current reference of the current sensing circuit for which the sensing window is set for optimal sensing of the current throughout a non-volatile memory cell.

11. The circuit of claim 9, wherein the current mirror comprises a first field-effect transistor (FET) coupled to one terminal of the bandgap voltage circuit to form a first branch;

a second FET coupled to a first terminal of the resistor, wherein the second terminal of the resistor is coupled to a second terminal of the bandgap voltage circuit to form a second branch; and a third FET coupled to the first FET and the second FET and configured to apply the reference current having the programmable temperature slope to the load.

12. The circuit of claim 8, wherein the current reference circuit further comprises an operational amplifier for setting a first branch and a second branch of the current mirror to a common potential.

13. The circuit of claim 8, wherein the bias voltage circuit comprises a digital-to-analog converter coupled to the bandgap voltage circuit.

14. The circuit of claim 8, wherein the bias voltage circuit configured further comprises a programmable voltage divider coupled to the coupled to the bandgap voltage circuit.

15. The circuit of claim 8, wherein the bandgap voltage circuit further comprises a first bipolar transistor and a second bipolar transistor, and wherein the at least one switch coupled between the bias voltage circuit and the bandgap voltage circuit comprises a first switch coupled to a base of the first bipolar transistor and a second switch coupled to a base of the second bipolar transistor, wherein the first switch and the second switch are configured to apply a bias voltage to one of the base of the first bipolar transistor and the base of the second bipolar transistor and ground potential to the other of the base of the first bipolar transistor and the base of the second bipolar transistor.

16. The circuit of claim 15, wherein the first switch and the second switch are n-type metal oxide semiconductor (NMOS) transistors.

17. The circuit of claim 16, wherein a polarity of the bias voltage is selected based on a supply voltage applied to one of the gates of the first NMOS transistor and the second NMOS transistor and ground potential to the other of the gates of the first NMOS transistor and the second NMOS transistor.

18. The circuit of claim 15, wherein the bias voltage circuit comprises a digital-to-analog converter coupled to the first switch and the second switch.

19. The circuit of claim 15, wherein the bias voltage circuit comprises a programmable voltage divider coupled to the first switch and the second switch.

20. A method, comprising:

applying a bandgap voltage of a bandgap voltage circuit to a resistor to form a reference current and programming a bias voltage circuit to add a variable-polarity bias voltage to the bandgap voltage to cause the reference current to have a variable slope relative to temperature.

21. The method of claim 20, wherein the programmable temperature slope is programmable as one of positive, zero, and negative relative to temperature.

* * * * *